United States Patent [19]
Goubault et al.

[11] Patent Number: 5,444,488
[45] Date of Patent: Aug. 22, 1995

[54] METHOD AND APPARATUS FOR CODING DIGITAL DATA USING VECTOR QUANTIZING TECHNIQUES

[75] Inventors: Eric Goubault, Paris; Emmanuel Lancon, Nice; Jean Menez, Cagnes-Sur-Mer; Catherine Raimondo, Villeneuve Loubet, all of France

[73] Assignee: International Business Machines Corporation, Armonk, N.Y.

[21] Appl. No.: 77,009

[22] Filed: Jun. 15, 1993

[30] Foreign Application Priority Data

Jun. 30, 1992 [EP] European Pat. Off. ............ 92480097

[51] Int. Cl.⁶ ................................................ H04N 7/28
[52] U.S. Cl. ..................................... 348/414; 348/417; 348/418; 348/422
[58] Field of Search ............... 348/422, 414, 417, 418; H04N 7/13, 7/137

[56] References Cited

U.S. PATENT DOCUMENTS

| | | | |
|---|---|---|---|
| 4,670,851 | 6/1987 | Murakami et al. | 348/418 |
| 4,979,039 | 12/1990 | Kisor et al. | 348/422 |
| 5,031,037 | 7/1991 | Israelsen | 348/422 |
| 5,067,152 | 11/1991 | Kisoe et al. | 348/422 |
| 5,113,516 | 5/1992 | Johnson et al. | 395/500 |
| 5,194,864 | 3/1993 | Nakano | 348/422 |

FOREIGN PATENT DOCUMENTS

| | | | |
|---|---|---|---|
| 0138061 | 4/1985 | European Pat. Off. | G10L 7/08 |
| 0446968 | 9/1991 | European Pat. Off. | H04N 7/13 |
| 9009079 | 8/1990 | WIPO | H04N 7/12 |
| 9114342 | 9/1991 | WIPO | H04N 7/167 |

*Primary Examiner*—Howard W. Britton
*Attorney, Agent, or Firm*—John J. Timar

[57] ABSTRACT

A vector quantization encoder comprises a codebook built with the so-called Linde-Buzo-Gray (LBG) algorithm, an intermediary codebook built from the initial codebook (LBG) and a Hash-table containing subsets of the initial codebook (LBG). Vector quantization is then performed in two steps. First, a multistep prequantization of an input vector gives an index in the Hash-table which points to a subset of vectors of the initial codebook (LBG). Then a full search is performed within the pointed subset of vectors of the initial codebook (LBG).

9 Claims, 17 Drawing Sheets

FIG. 1
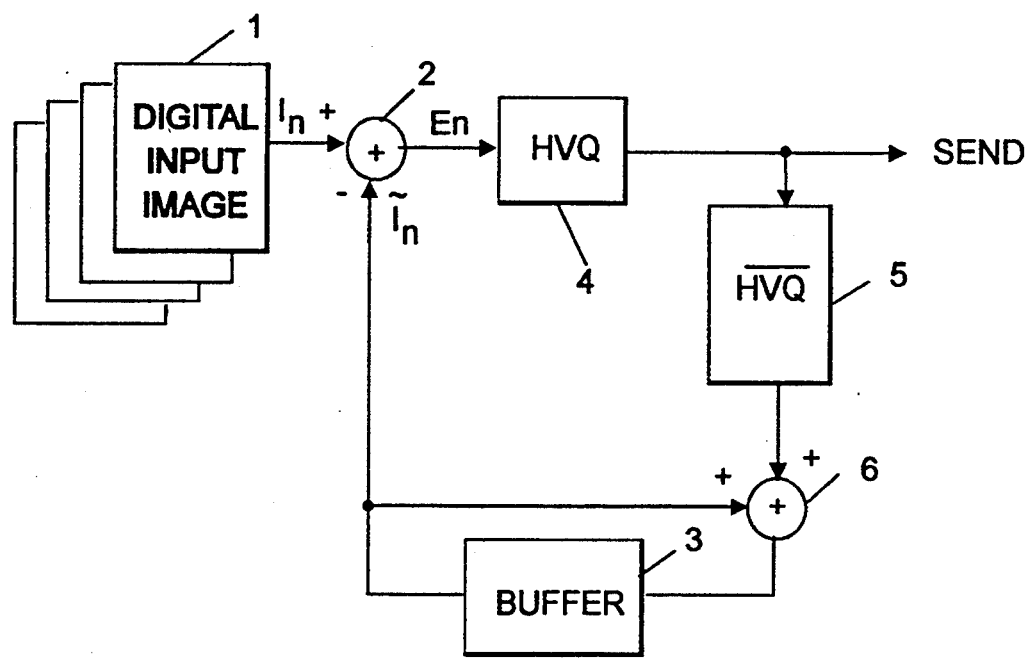
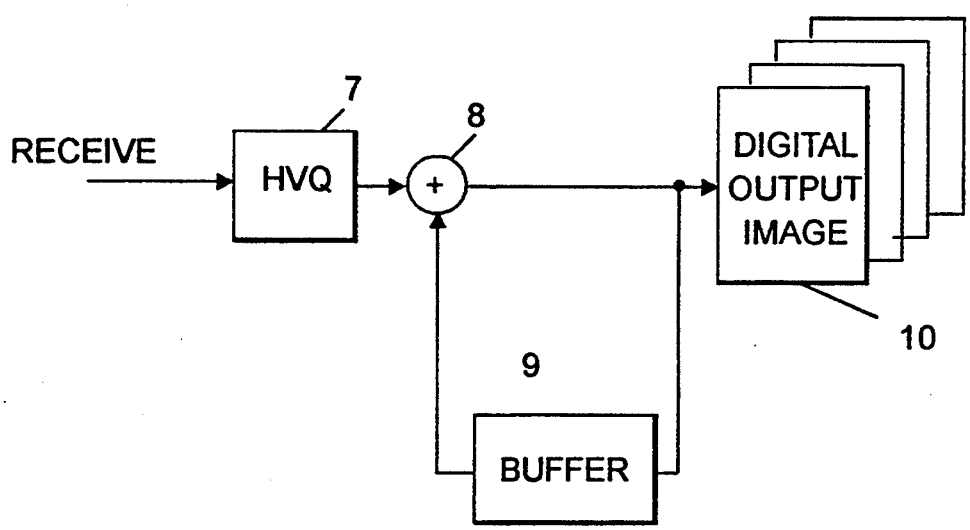

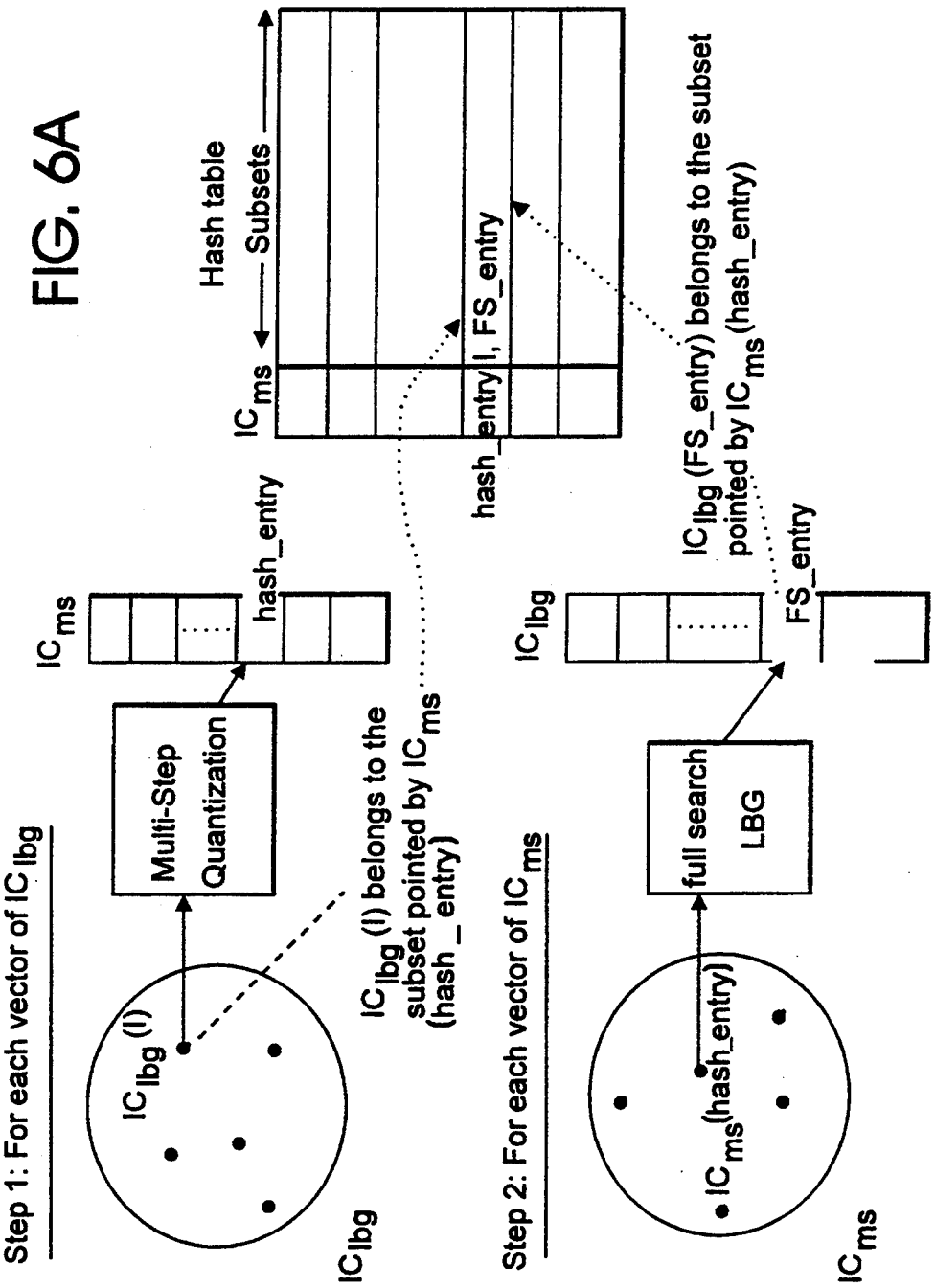

METHOD AND APPARATUS FOR CODING DIGITAL DATA USING VECTOR QUANTIZING TECHNIQUES

TECHNICAL BACKGROUND

This invention relates to a method for efficiently coding digital data and more particularly to an improved method for performing data compression over image or video data using Vector Quantizing (VQ) techniques.

PRIOR ART

One of the basic problems in processing data, particularly when these data are derived through digital encoding of image or video signals lies with the volume of data to be processed.

A number of techniques, including so-called Vector Quantizing (VQ) techniques have been proposed to optimize the flow of data to be processed, by performing a data compression operation over the original data.

The VQ techniques are particularly efficient in terms of compression due to the very principles involved. The signal samples to be encoded, for example, pixels, when dealing with images, are grouped into input vectors, each made of N samples. Then each input vector is represented by the address of a prestored vector (codeword) selected within a predefined dictionary (codebook) for best matching or closeness. The notion of closeness is related to the Euclidian distance between vectors. The larger the distance, the higher the quantization or the mean square error, the lower the SNR and the objective quality. The obivous method for selecting the best matching codeword should require full search throughout the whole codebook.

Now, if one considers than not only to determined how a considered input vector matches with an given codeword, already requires a large computing power, but also that efficient coding is also directed related to the codebook size, one may then understand the importance of simplifying codebook searches without impairing on the encoding/quantizing quality.

A number of techniques have already been proposed to optimize codebook search efficiency. For reference to these methods one may refer to an article entitled "Image Coding Using Vector Quantization: A review", by N. Nasrabadi and R. A. King, IEEE Trans. Communications, Vol. 36, No. 8, Aug. 19, 1986.

These method might be sub-optimal for certain applications, e.g. for moving pictures.

OBJECTS OF INVENTION

It is therefore a principal object of the invention to provide an improved method and a device for coding digital data using Vector Quantization wherein the number of comparisons is reduced while guaranteeing the same quality as a full search in the codebook.

SUMMARY OF THE INVENTION

Specifically, the present invention provides a vector quantization encoder which comprises a codebook built with the so-called Linde-Buzo-Gray (LBG) algorithm, an intermediary codebook built from the initial codebook (LBG) and a Hash-table containing subsets of the initial codebook (LBG).

Vector quantization it then performed in two steps. First, a multistep prequantization of an input vector gives an index in the Hash-table which points to a subset of vectors of the initial codebook (LBG). Then a full search is performed within the pointed subset of vectors of the initial codebook (LBG).

The coder is designed such that the overall complexity of the prequantization process and the full search process applied to a reduced number of vectors of the initial codebook (LBG) is fairly reduced while guaranteeing the same level of quality.

This an other objects, characteristics and advantages of the invention will be more readily described with reference to the attached figures of a preferred embodiment.

BRIEF DESCRIPTION OF THE DRAWINGS

FIG. 1 is a block diagram of a vector quantization encoder and decoder according to an embodiment of the present invention.

FIG. 6 represents the different steps of the building of the Hash-table.

DETAILED DESCRIPTION OF PREFERRED EMBODIMENT

Figure 2:
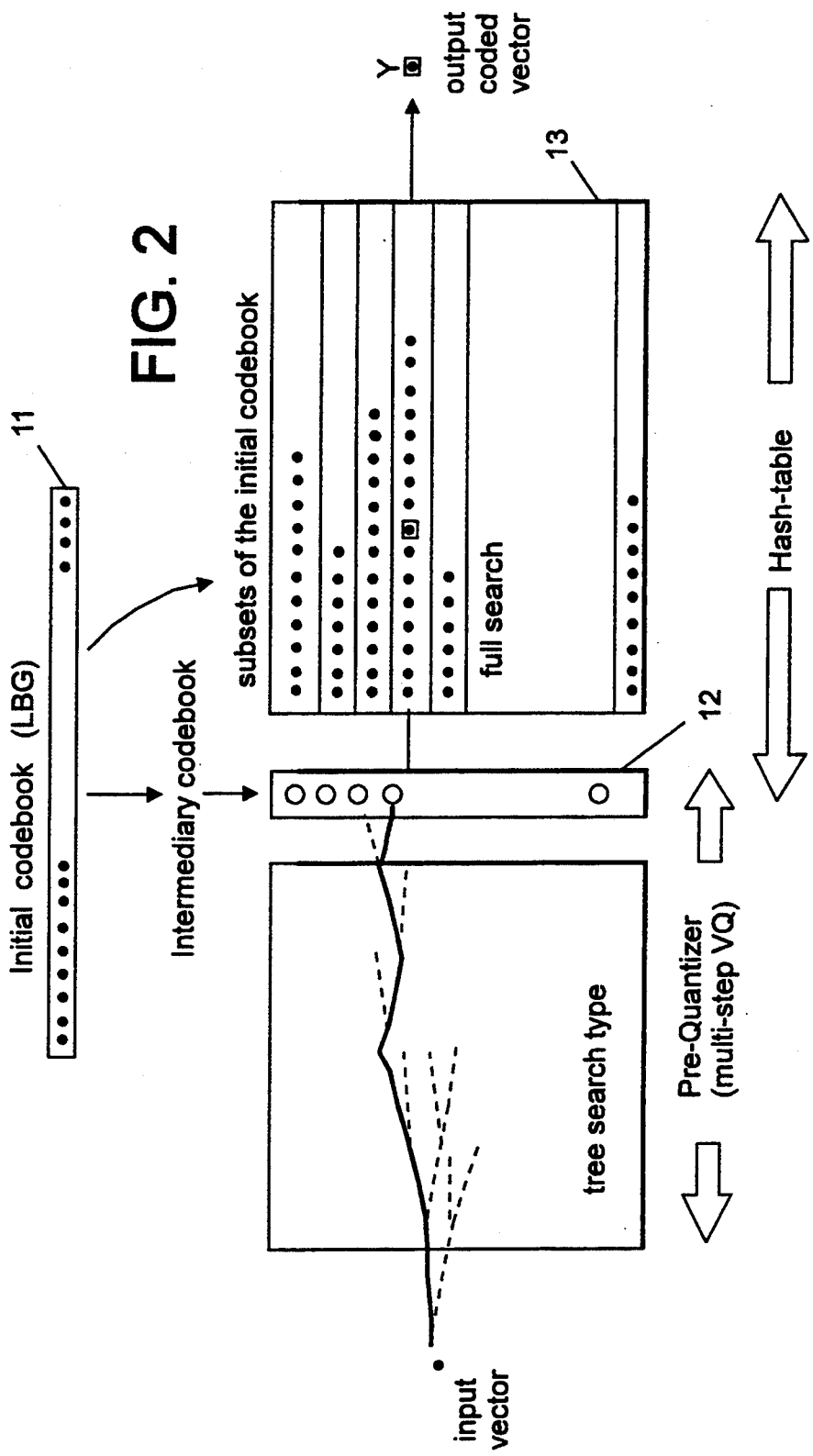
FIG. 2 is a block diagram illustrating the Hash-table Vector Quantization method of the present invention.

Referring now to FIG. 1, there is shown a vector quantization encoder according to the invention. A series of input digital images $I_n$ 1 is applied to subtractor 2. Each digital image $I_n(x,y)$ is an array of pixels where x is the number of columns and y is the number of rows. As will be explained later, the output $\tilde{I}_{n-1}$ of a frame memory or buffer 3 is applied to subtractor 2, which generates a signal $E_n$ representative of a temporal prediction error. Vector quantizer 4 receives the output of subtractor 2 and quantizes said prediction error signal, formed of the difference between the new input digital image and its prediction based on past coded outputs. The output of said vector quantizer is send to a receiver and simultaneously applied to inverse vector quantizer 5. The output of inverse vector quantizer is applied to an adder 6 which combines the output of buffer 3 and applies its output to buffer 3. Buffer 3 introduces a one frame delay to the input signal and supplies its output to the subtractor 2 as the prediction $\tilde{I}_n$ of a new input digital image, thereby providing the prediction error signal $E_n$. At the receiver the encoded signals are applied to an inverse vector quantizer 7. The output of inverse quantizer 7 is applied to adder 8 and the output of adder 8 is applied to buffer 9 and simultaneously provides the series of decoded output digital images 10.

As shown in FIG. 2, the vector quantization encoder of the invention comprises an initial codebook 11 built with the so-called Linde-Buzo-Gray (LBG) algorithm, an intermediary codebook 12 built from the initial codebook and a Hash-table 13 containing subsets of the initial codebook.

The Vector Quantization (VQ) is performed in two steps:

1. Each prediction error image is divided into 4×4 vectors. A pre-quantization of each input vector provides an index to the Hash-table which points to a subset of the initial codebook. The pre-quantization is performed using a multi-step VQ technique. The input vector is encoded by means of a vector of the intermediary codebook the index of which points to the Hash-table. The vector in the intermediary codebook is a representative of the subset in the initial codebook.
2. A full search within the pointed subset of vectors of the initial codebook provides the encoded vector. The number of vectors in each subset is small enough that the total number of "searches" leading to the coded vector is significantly reduced.

To achieve steps 1 and 2 it is necessary to:
1. build the pre-Quantizer or intermediary codebook (multi-step VQ)
2. and build the Hash-table.

These two steps (like the elaboration of the original codebook) require a lot of processing which is not taken into account when encoding.

The construction of the different codebooks used in the present invention will now be described. The initial codebook $IC_{lbg}$ is designed based on an algorithm proposed by Y. Linde, A. Buzo and R. M. Gray in an article entitled: "An Algorithm for Vector Quantizer Design", IEEE Transactions on Communications, Vol. COM-28, No.1, January 1980, pages 84–95. The Linde-Buzo-Gray algorithm defines the construction of a codebook adapted to the signal to be encoded and the quantization process.

Figure 3:
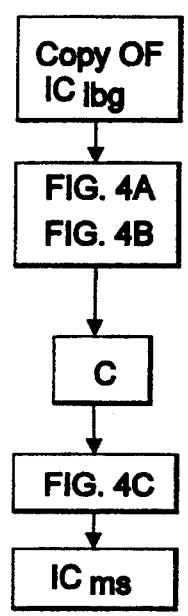
FIG. 3 is a block diagram representing the building of the intermediary codebook.

FIG. 3 is a block diagram illustrating the building of the intermediary codebook.

The intermediary codebook $IC_{ms}$ is built from the initial codebook $IC_{lbg}$, using Multi Step VQ and $IC_{lbg}$ as a training sequence. First a set C (FIG. 3) containing the vectors used in the prequantization is built. Then $IC_{ms}$ is built from said set of vectors.

STEP 1: (M=1)

From the $IC_{lbg}$, a codebook of 2 vectors $C_1$ and $C_2$ equal to $C_1$ plus a perturbation, is built, using the LBG algorithm or a gradient method. $IC_{lbg}$ is therefore partitioned into two subsets $P_1$ and $P_2$, $C_1$ and $C_2$, being the average vectors of $P_1$ and $P_2$, respectively.

A new training sequence is then constructed by subtracting from each vector of each subset its representative vector and the two new subsets are put together to form the new training sequence: $(P_1-C_1) \cup (P_2-C_2)$.

STEP 2: (M=2)

STEP 1 is repeated with the new training sequence. $P_3$ and $P_4$ are represented by $C_3$ and $C_4$. The new training sequence is: $(P_3-C_3) \cup (P_4-C_4)$.

STEP K: (M=K)

At this point, the 2 new partitions are $(P_{2K-1}-C_{2K-1})$ and $(P_{2j}-C_{2K})$ and the representative vectors $C_{2K-1}$ and $C_{2K}$.

At step K, $IC_{ms}$ contains $2^K$ vectors built from linear combinations of the vectors $C_1, C_2, \ldots C_{2K-1}, C_{2K}$.

Figures 4A, 4B:
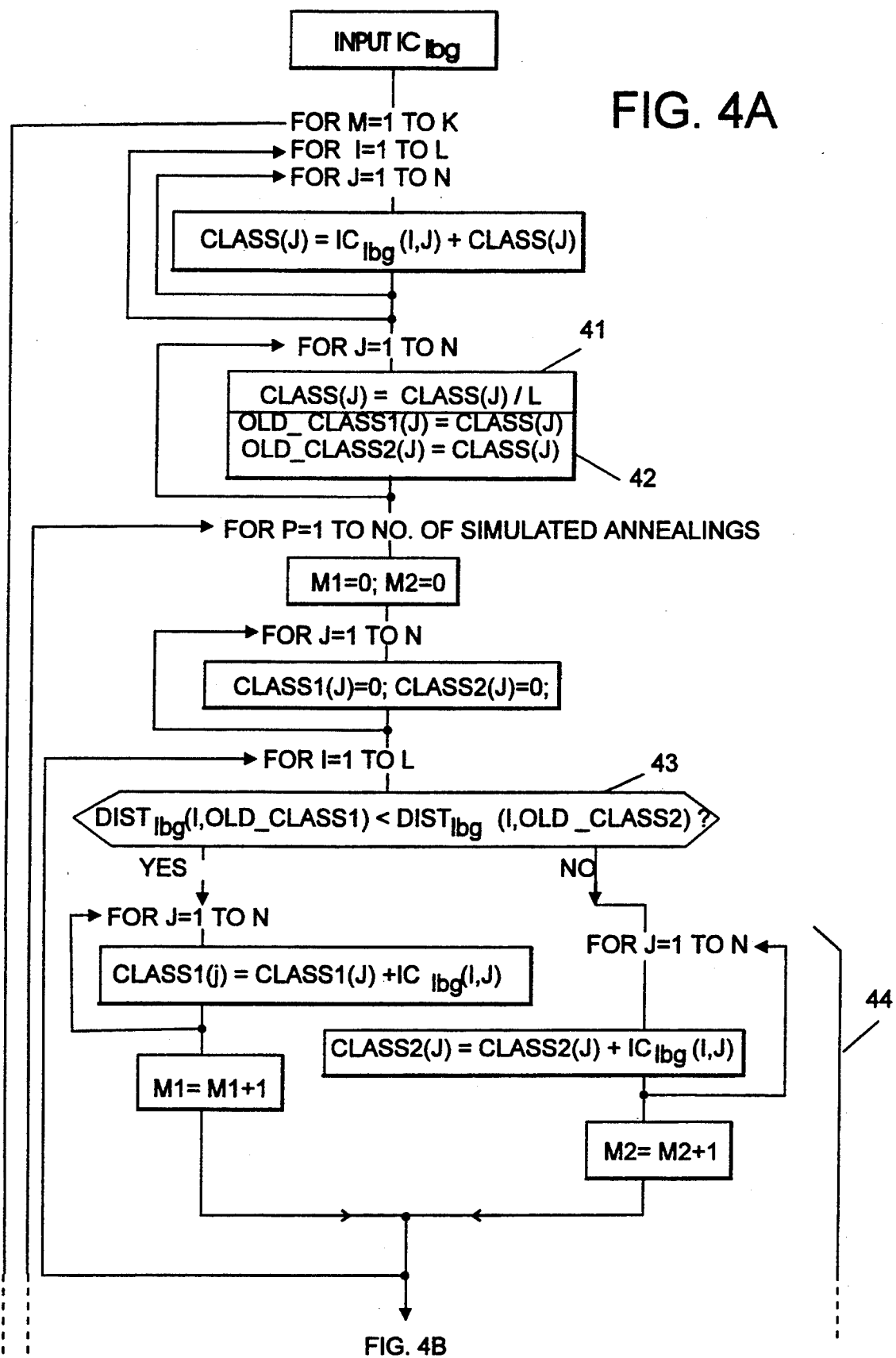
FIGS. 4A-C are flow diagrams representing different steps of the building of the intermediary codebook.
Figure 4B:
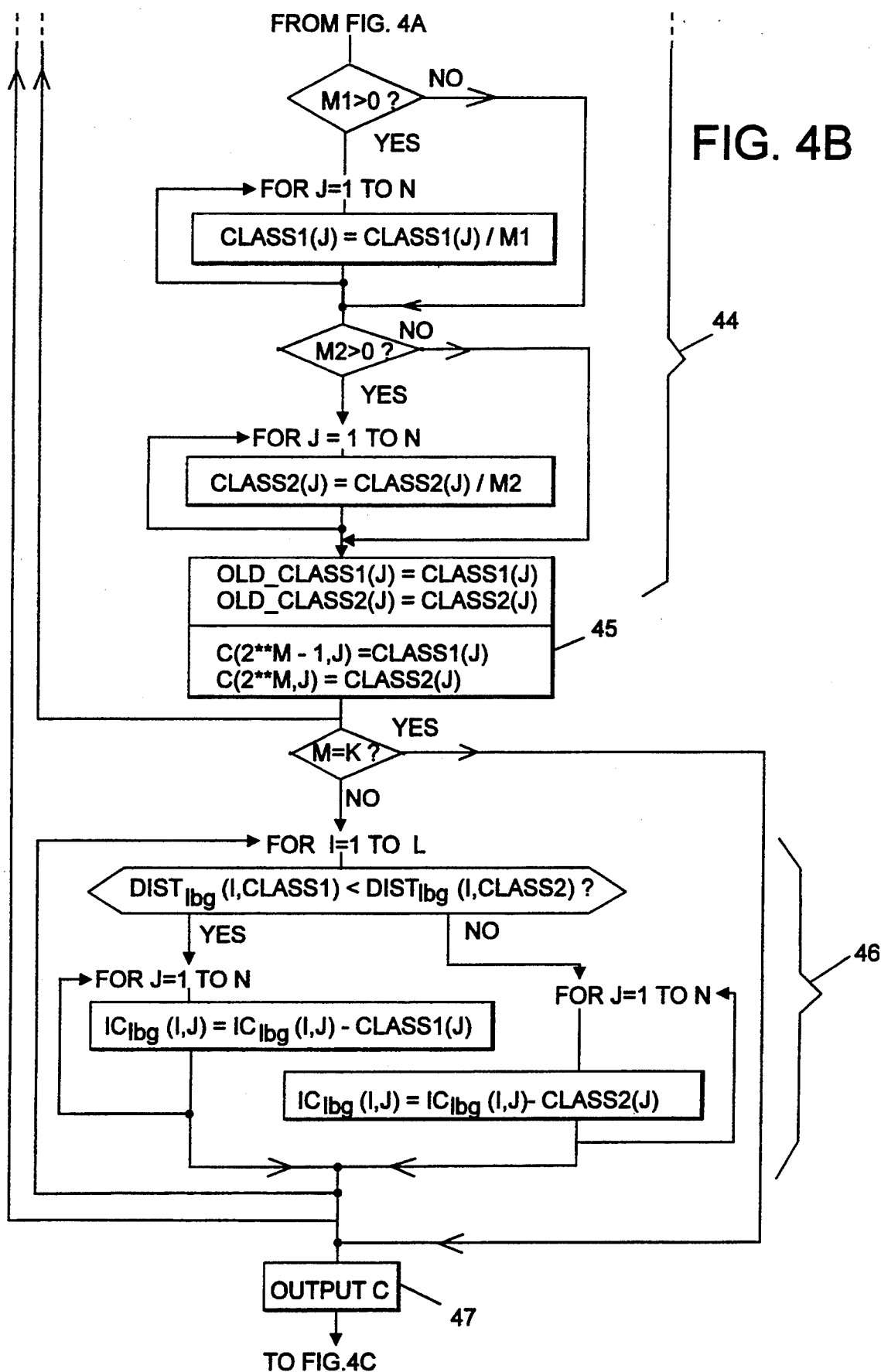
Figure 4C:
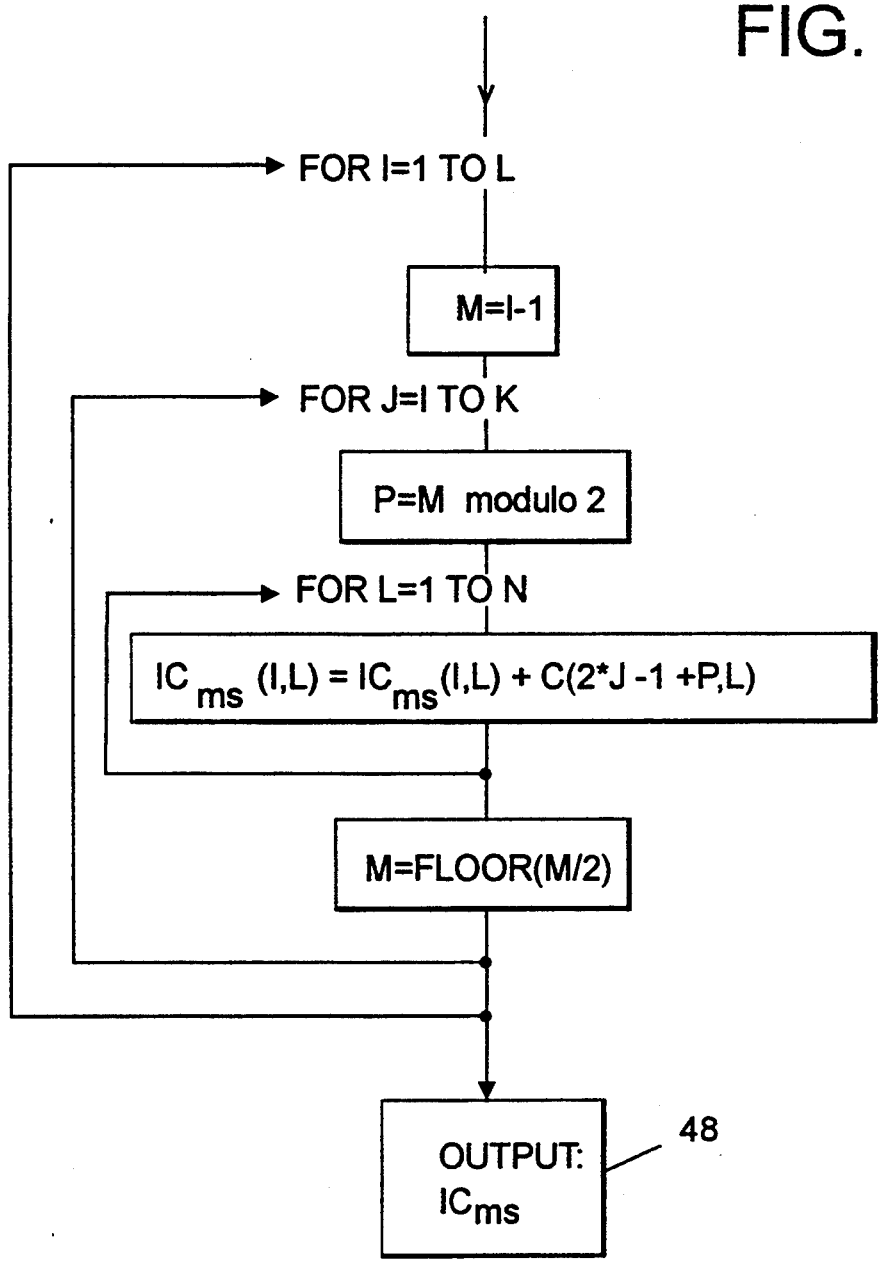

FIGS. 4A–C are flow diagrams representing the detailed operations used to build the intermediary codebook $IC_{ms}$. Given these flow diagrams a man skilled in the art will have no trouble implementing these operations into a program or microcode without undue effort.

First, starting from a copy of the codebook $IC_{lbg}$, the average vector corresponding to the initial class is computed. After normalization (41), a small perturbation is added to the average vector (42). A value of 2, which is small with respect to the dynamics of the signal is chosen. The vectors of the first partition are split into two new partitions, OLD_CLASS1 and OLD_CLASS2, according to their distance (see FIG. 10A) to the average or perturbed average vectors (43). Note that M1 and M2 are counters of the number of vectors in each partition which are used later for normalization purpose. A new average vector is computed for each new partition (44) and the successive vectors saved to build the $IC_{ms}$ (45). The process is repeated, by building a new training sequence for the next iteration (46). At the end of the process, a set of 16 C vectors is obtained to build the $IC_{ms}$ (47).

The number of iterations or simulated annealings used to build the codebook is preferably of 40.

All possible combinations of the C vectors that correspond to a coded representation of an input vector by the multi-step coder are stored in the codebook $IC_{ms}$. Each combinations corresponds to a path in a tree representing all possible choices at each step of the multi-step pre-quantization coding process. FIG. 4C shows the building of the linear combinations and the processing of their corresponding index (location) in the codebook in such a way that the coding process described below in FIG. 9A, when travelling along the tree, ends up with the right index representing the right coded representation of the input vector. Finally, the $IC_{ms}$ containing 256 vectors is obtained (48).

Pre-quantization thus gives a vector or index which points to a subset of the initial codebook $IC_{lbg}$ in the Hash-table.

Figure 5:
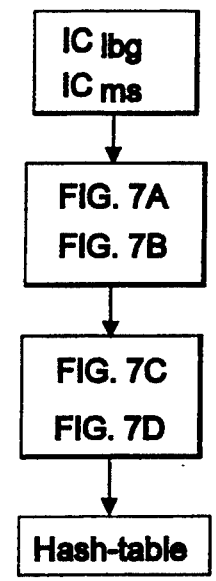
FIG. 5 is a block diagram representing the building of the Hash-table.

As shown in FIG. 5, to build the Hash-table, $IC_{lbg}$ must now be divided in as much subsets as the size of the intermediate codebook $IC_{ms}$, i.e. $2^K$. The Hash-table will thus have $2^K$ rows. The intersection of the $2^K$ subsets can be non-empty. One needs to ensure that:
 all the vectors of $IC_{lbg}$ are used,
 and that each row of the Hash-table contains at least one vector of $IC_{lbg}$.

The construction of the Hash-table will now be described with reference to FIG. 6.

Once the codedbook $IC_{ms}$ of the Multi-step quantizer has been built. Multi-step quantization is used to fill the Hash table. Let $IC_{ms}$ (hash-entry) be the coded representation of a vector X by multi-step quantization. Hash_entry points to a subset of vectors of $IC_{lbg}$ and the result of the whole quantization process will be to determine the closest vector to X in that subset using the full search method. Therefore, building the Hash table consists in finding the vectors of $IC_{lbg}$ that belong to the subsets pointed by the vectors $IC_{ms}$ (hash_entry) and this for each vector of $IC_{ms}$. The vectors of $IC_{lbg}$ that belong to a subset pointed by a vector $IC_{ms}$ (hash_entry) are the closest in distance to that vector.

In fact, for efficiency, all the vectors in the Hash-Table that belong to the different subsets are represented by their index or position in their respective codebook.

The building of the Hash-Table is performed in four steps:

1. Make sure all the vectors of $IC_{lbg}$ will be present in the Hash-table (FIG. 6, step 1).

This is achieved by coding all the vectors of $IC_{lbg}$ by the multi-step quantizer. Let $IC_{ms}$ (hash_entry) be the coded representation of a vector of $IC_{lbg}$, $IC_{lbg}(I)$, the latter thus belongs to the subset pointed by hash_entry. All vectors of $IC_{lbg}$ are encoded, some of them may belong to the same subset (they have been encoded by the same $IC_{ms}$ (hash-entry), some subsets may therefore be empty.

2. Make sure no entry in the Hash table is empty (FIG. 6, step 2).

This is achieved by coding all the vectors of $IC_{ms}$ by the vectors of $IC_{lbg}$ using full search quantization. In doing so, each vector $IC_{ms}$ (hash-entry) will be given its closest representation in $IC_{lbg}$, $IC_{lbg}$(FS_entry) the index of which, FS_entry, will be put in the subset it is pointing to.

At this point, all vectors of $IC_{lbg}$ have been used and each vector of $IC_{ms}$ has a non empty subset. Still, some subsets might contain only one vector and some vectors of $IC_{lbg}$ might appear only once in the Hash table. To enrich it, one repeat the same two steps after having applied a random perturbation to all the vectors. The value of said random perturbation is comprised between 0 and 1 (0 being excluded) with an average of 0.5.

3. The modified version of a vector of $IC_{lbg}$, $IC_{lbs}(I)+p$, is coded by both MS and FS methods. Let $IC_{ms}$(hash-entry) and $IC_{lbg}$(FS entry) be the coded representations of $IC_{lbs}(IC)+p$, respectively. Therefore, $IC_{lbg}$ (FS entry) is put in the subset pointed by $IC_{ms}$ (hash-entry).

4. Repeat step 3, but now a random perturbation is applied to each vector of $IC_{ms}$. Let $IC_{ms}$ (hash-entry) and $IC_{lbg}$ (FS-entry) be the coded representations of $IC_{ms}(I)+p$, respectively. Therefore, $IC_{lbg}$ (FS entry) is put in the subset pointed by $IC_{ms}$ (hash-entry).

Step 3 and 4 are applied several times to further improve the Hash table. 40 runs brought satisfactory results. The larger the number of vector in each subset, the better the quality, the higher the computational complexity. The number of vectors in each subset can be limited. The average complexity corresponds to the average number of vectors in the subsets.

FIGS. 7A–D are flow diagrams of the different steps of the building of the Hash-table.

Building the Hash-table consists in filling subsets of vectors of $IC_{lbg}$ referenced by the vectors of $IC_{ms}$. For computational efficiency, the vectors of $IC_{ms}$ are represented by their index in this codebook and the vectors of $IC_{lbg}$ filling the subsets are represented by their index in that codebook.

Each vector of the initial codebook $IC_{lbg}$ is coded by the multi-step coder (71 and FIG. 10B). hash_entry is the index in $IC_{ms}$ of the coded representations of the input vector, I is the index of the input vector in $IC_{lbg}$. $IC_{ms}$ (hash_entry) is the coded representation of the vector $IC_{lbg}(I)$. Therefore the index I is added in the list of indexes pointed by the index hash_entry, i.e. the vector $IC_{lbg}(I)$ is added as a member of the subset represented by the vector $IC_{ms}$(hash_entry) (72). Adding an index is preceded by checking whether it has already been added previously or not. hlen(hash_entry) is the size of the subset pointed by $IC_{ms}$ (hash_entry) and is incremented each time a new vector is added.

Figure 10A:
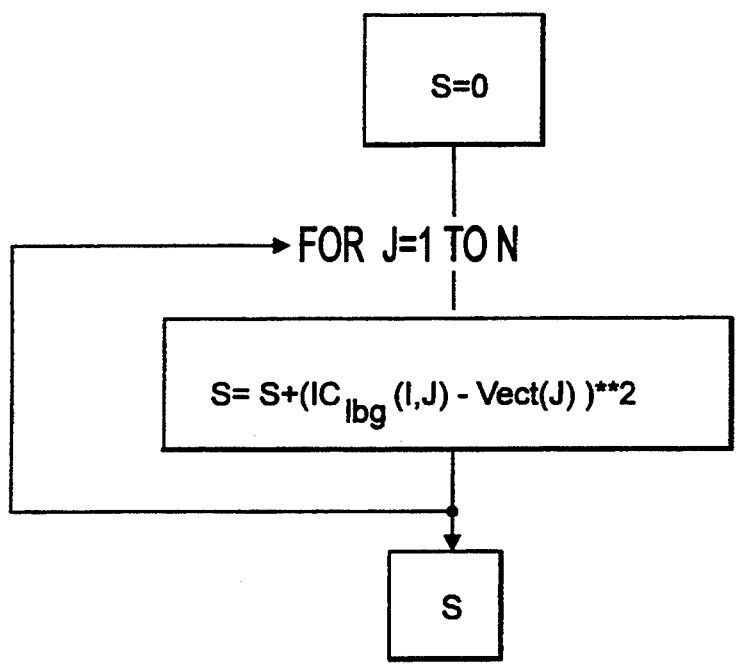
FIG. 10 A-D are flow diagrams of different functions used in FIGS. 4A-C, 7A-D and 9A-B.
Figure 10D:
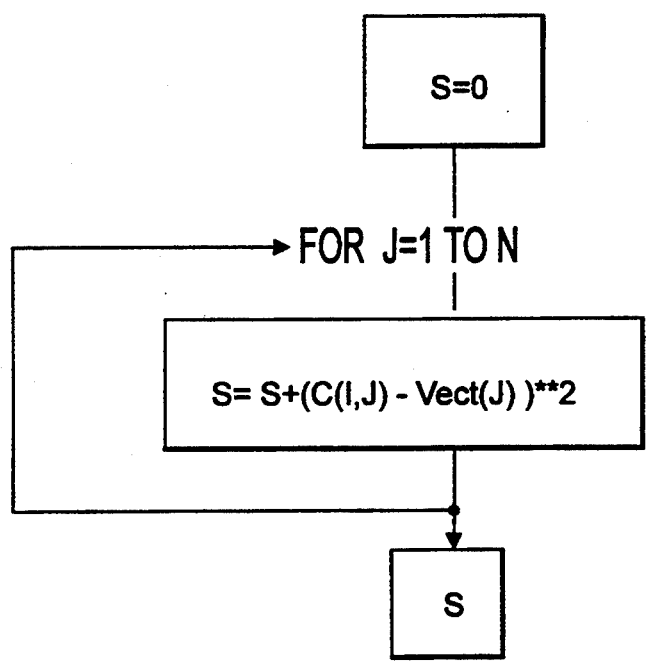
Figure 10B:
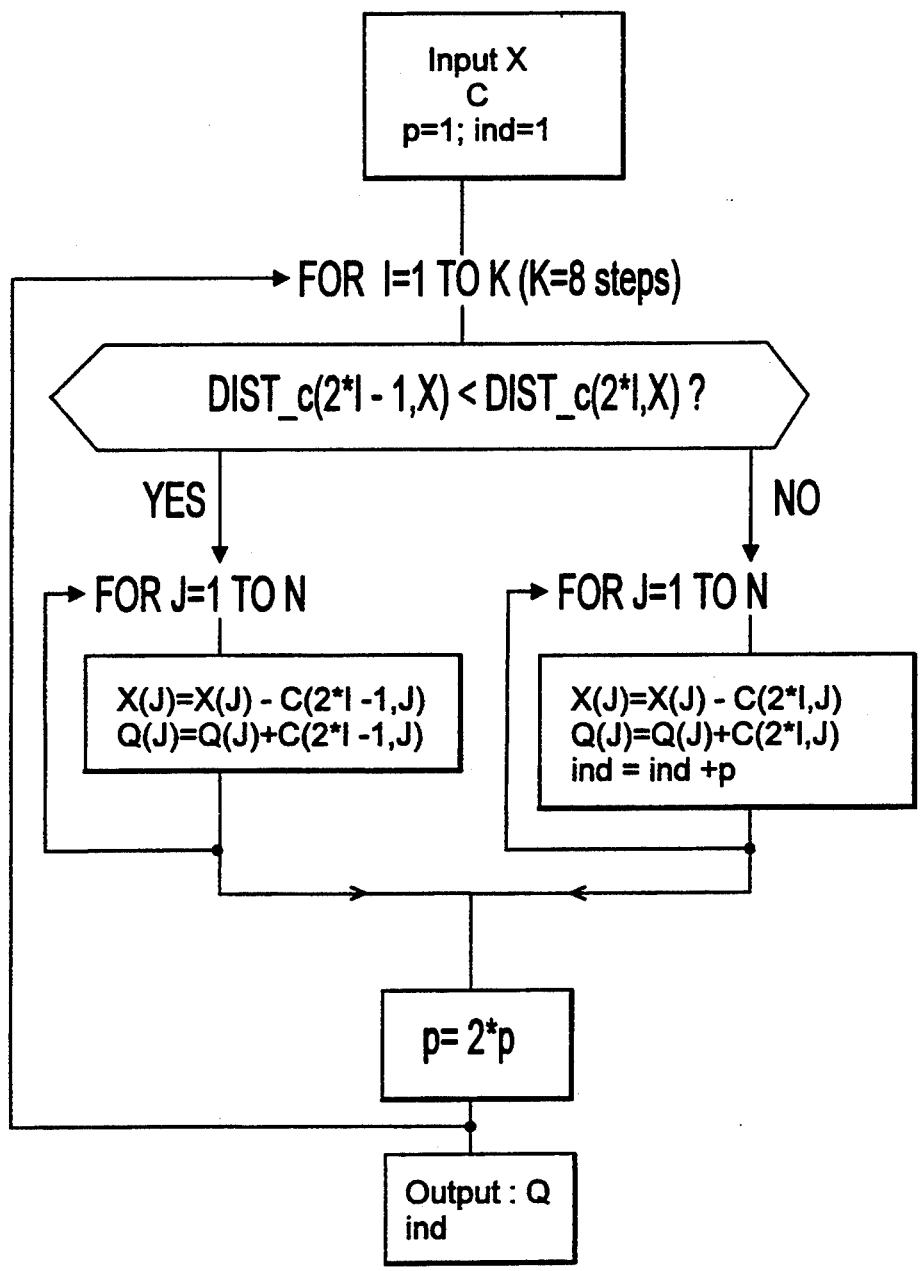
Figure 10C:
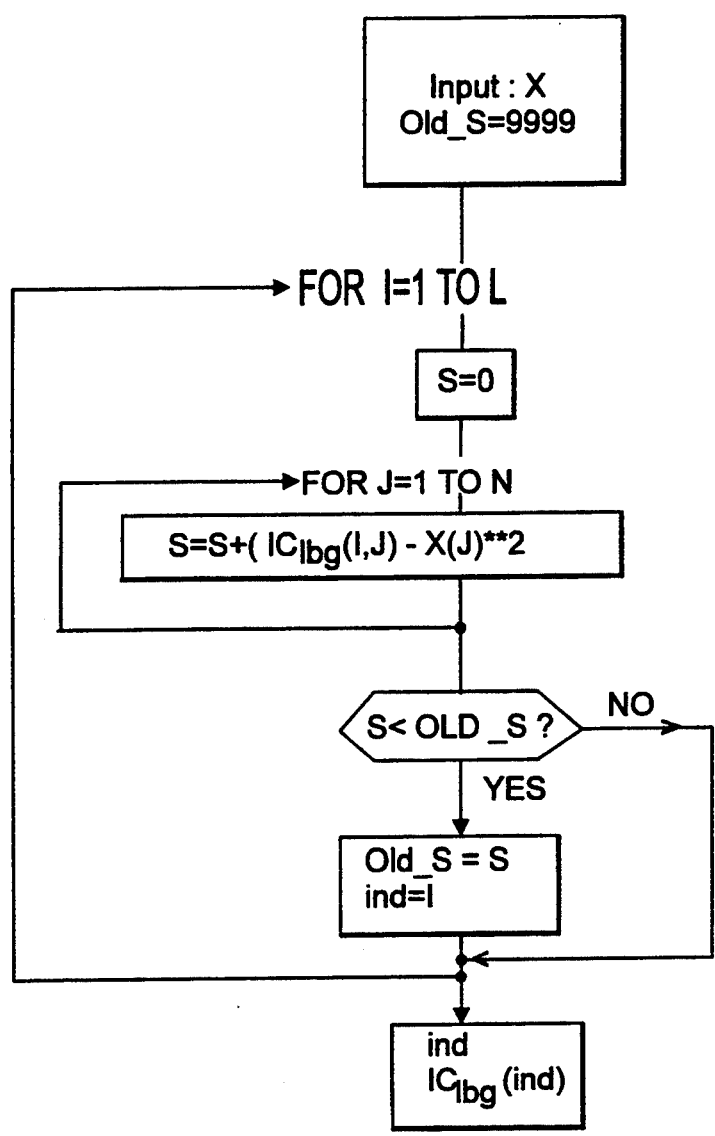

Each vector of the intermediate codebook $IC_{ms}$ is encoded by the initial codebook $IC_{lbg}$ according to the LBG full search algorithm (73 and FIG. 10C). FS_entry is the index in $IC_{lbg}$ of the coded representation of the input vector. I is the index of the input vector in $IC_{ms}$. $IC_{lbg}$(FS_entry) is the coded representation of the vector $IC_{ms}(I)$. Therefore the index FS_entry is added to the list of indexes pointed by the index I, i.e. $IC_{lbg}$ (FS_entry) is added as a member of the subset represented by the vector $IC_{ms}(I)$ (74). Adding an index is preceded by checking whether it has already been added previously or not. hlen(I) is the size of the subset pointed by $IC_{ms}(I)$ and is incremented each time a new vector is added.

Now, a random perturbation is applied to each vector of $IC_{lbg}$ prior to encoding (75). The vector is coded by both multi-step and full search methods (76) to obtain the two following indexes: hash_entry and FS_entry for multi-step and lbg full search respectively. The input vector has therefore the two following coded representations according to the two coding methods: IC_ms (hash_entry) and $IC_{lbg}$ (FS_entry). Therefore the index FS_entry is added to the list of indexes pointed by the index hash_entry, i.e. the vector $IC_{lbg}$ (FS_entry) is added as a member of the subset represented by the vector $IC_{ms}$(hash_entry) (77). Adding an index is preceded by checking whether it has already been added previously or not. hlen(hash_entry) is the size of the subset pointed by $IC_{ms}$(hash_entry) and is incremented each time a new vector is added.

The perturbation of the vectors of the codebook $IC_{lbg}$ is used to add new members to the subsets in creating new relationships (in terms of closeness/distance) between the vectors of $IC_{ms}$ and of $IC_{lbg}$. This process is repeated ITER=40 times.

Figure 8:
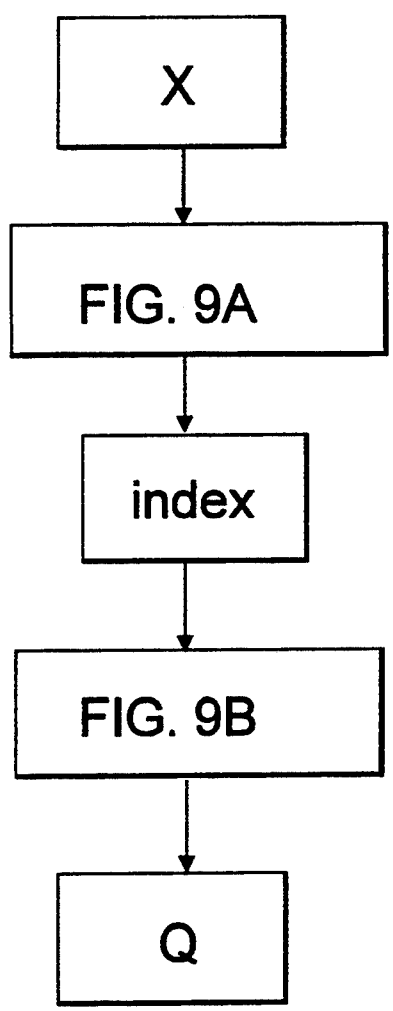
FIG. 8 is a block diagram representing the coding process.

FIG. 8 is a block diagram illustrating the coding process of the invention.

As previously stated Vector Quantization is performed in two steps which will now be described.

Figure 9A:
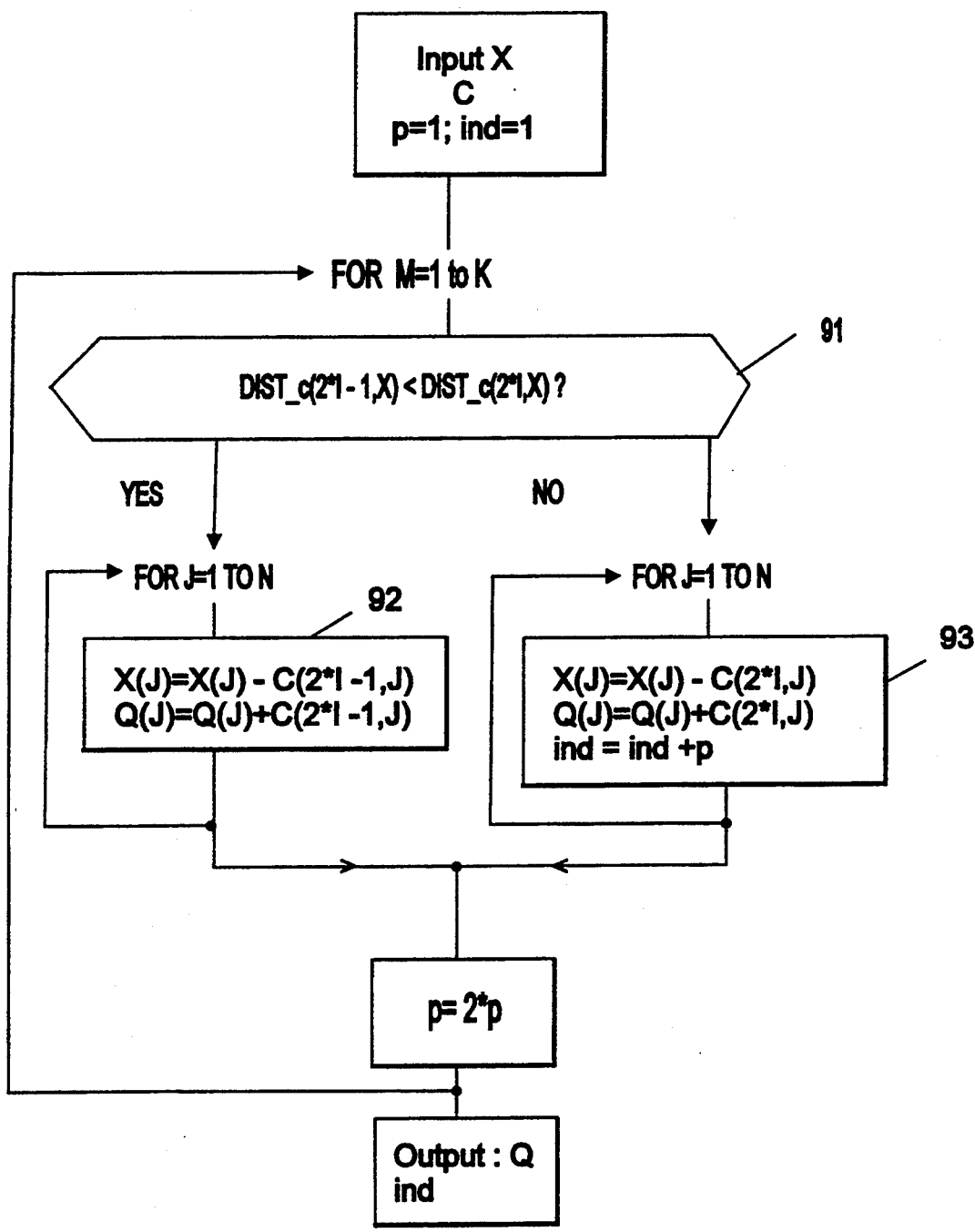
FIGS. 9A-B are flow diagrams the coding process.

Referring to FIG. 9A, a prequantization of the input vectors is performed using a multi-step vector quantization technique.

The vectors $C_1, \ldots C_{2K}$ are used to find the closest (in terms of quantization error) vector to be coded by a vector of $IC_{ms}$, to an input vector in a multi-step way.

An input vector X is compared in distance to 2 vectors $C_{2M}$ and $C_{2M-1}$ to find the closest one. Let $dist(X, C_{2M})$ and $dist(X, C_{2M-1})$ be those distances to be compared respectively (91 and FIG. 10D).

If $dist(X, C_{2M}) \geq dist(X, C_{2M-1})$ then $C_{2M-1}$ is selected (92), If $dist(X, C_{2M}) > dist(X, C_{2M-1})$ then $C_{2M}$ is selected (93).

The output vector being a sum of the $C_{2M}$ or the $C_{2M-1}$, and its index (location) in $IC_{ms}$ depending on the result of the previous comparison, is constructed step by step by subtracting it from X. Its index (location) in $IC_{ms}$ is also computed step by step, depending on the progression in the tree. This process is repeated at each step, from M=1 to 8, leading to find the closest vector to X among the 256 vectors of $IC_{ms}$. The index of the closest vector points to a subset of vectors of the initial codebook $IC_{lbg}$ and one finds the closest vector to X in that subset using the full search method (FIG. 9B).

Figure 9B:
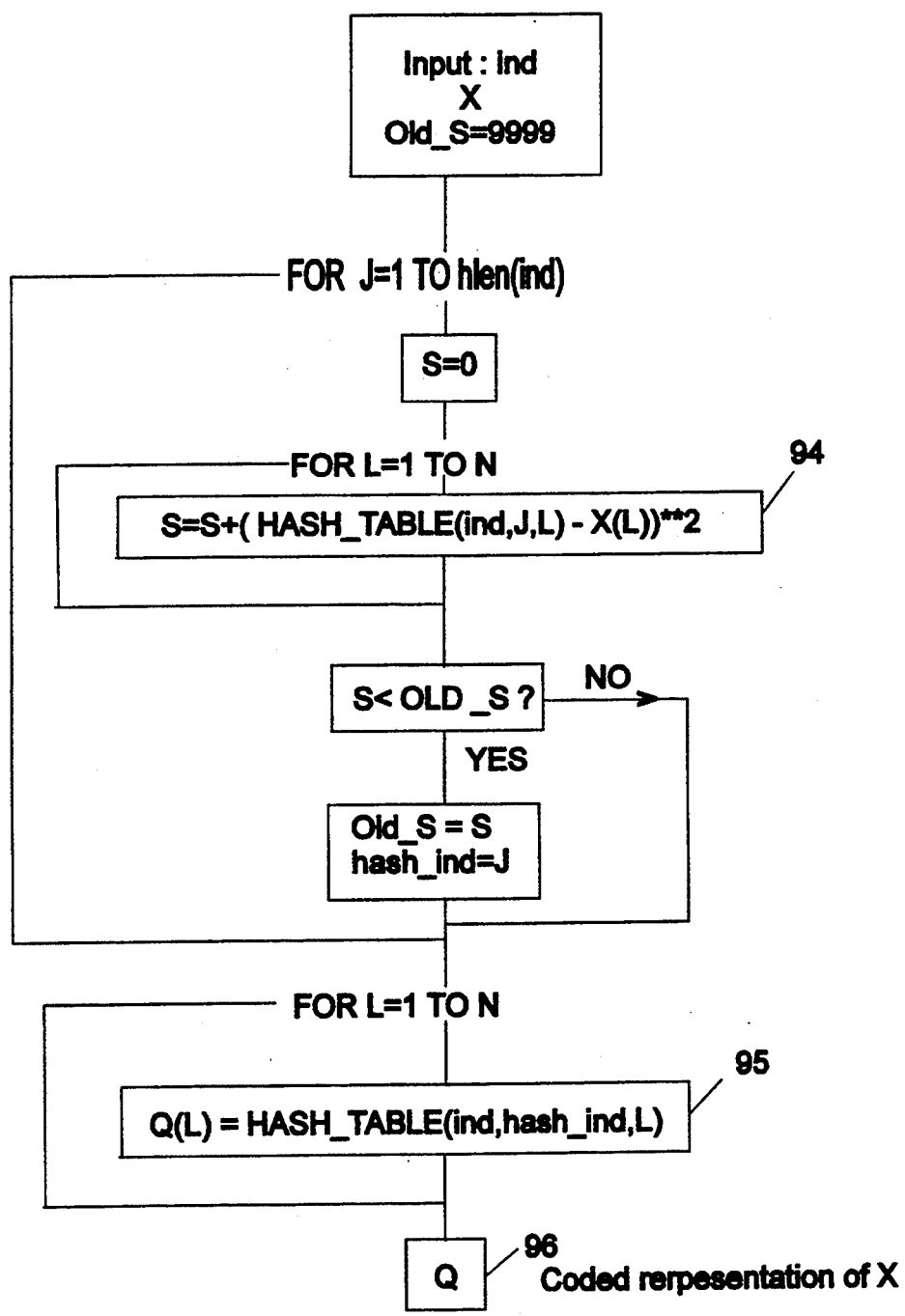

Referring to FIG. 9B, full search is performed to encode the input vector X by the subset of vectors selected by the pre-quantization step. For each vector of the subset, one computes its distance from X (94). The index of the closest vector is retained by saving the minimum distance. The output vector is finally built (95) and obtained in (96).

One can notice that the output vector is nothing but $IC_{lbg}$ (hash_ind).

FIG. 10A is a flow diagram of the function S=DIST_lbg (I,vect), computing the Euclidian distance between the Ith vector of $IC_{lbg}$ and Vect, of FIG. 4A.

Figure 7A:
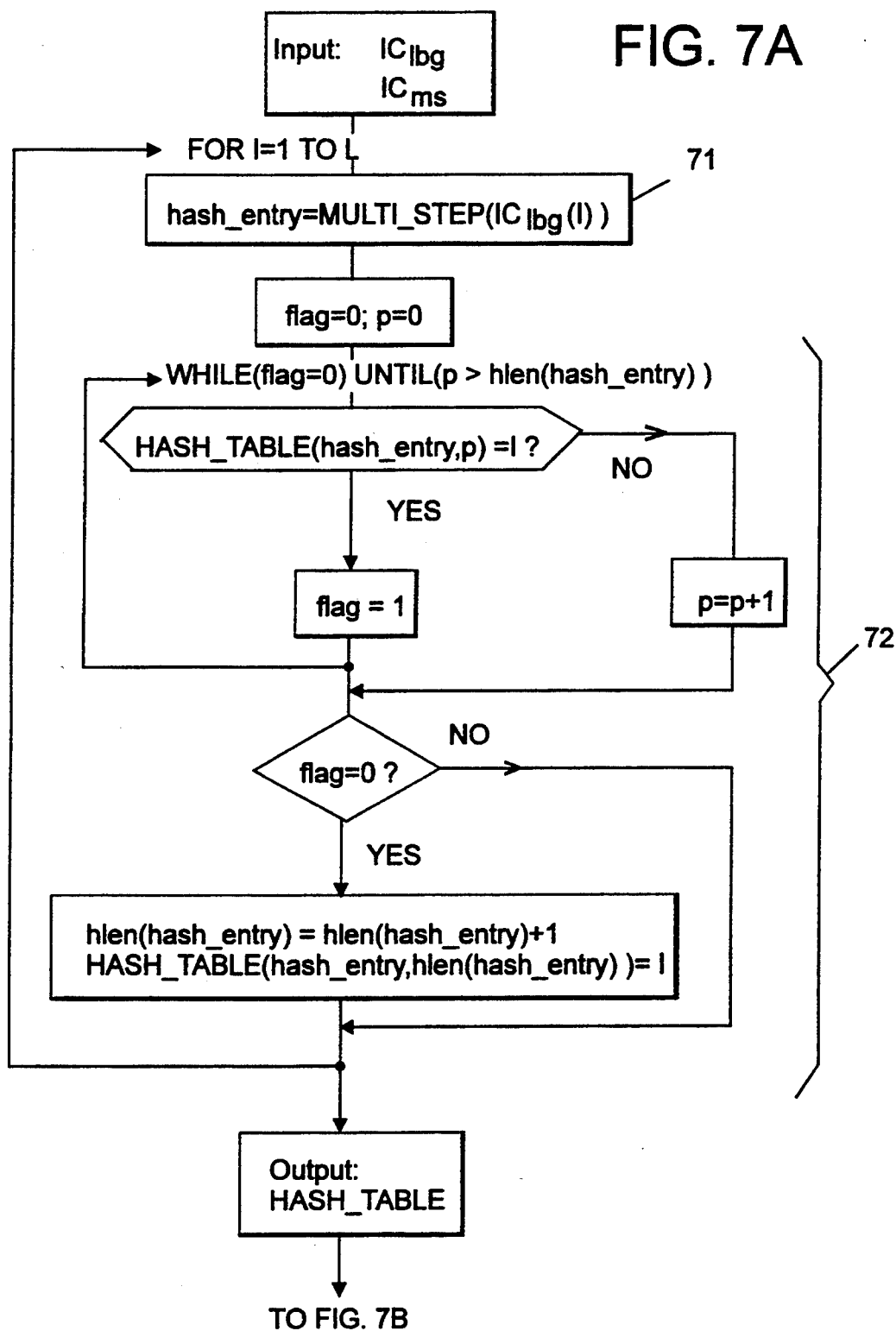
FIGS. 7A-D are flow diagrams representing different steps of the building of the Hash-table.
Figure 7B:
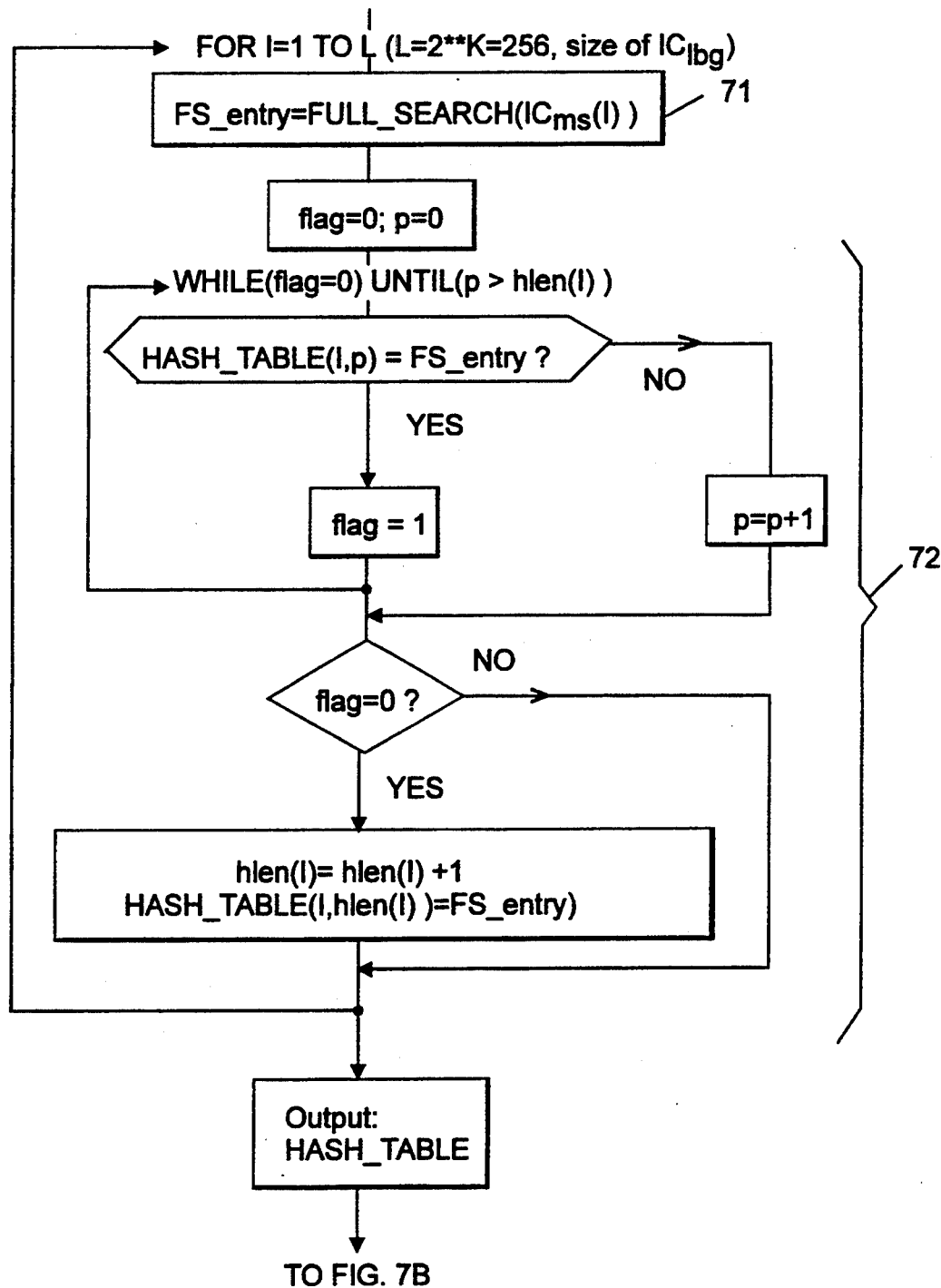
Figure 7C:
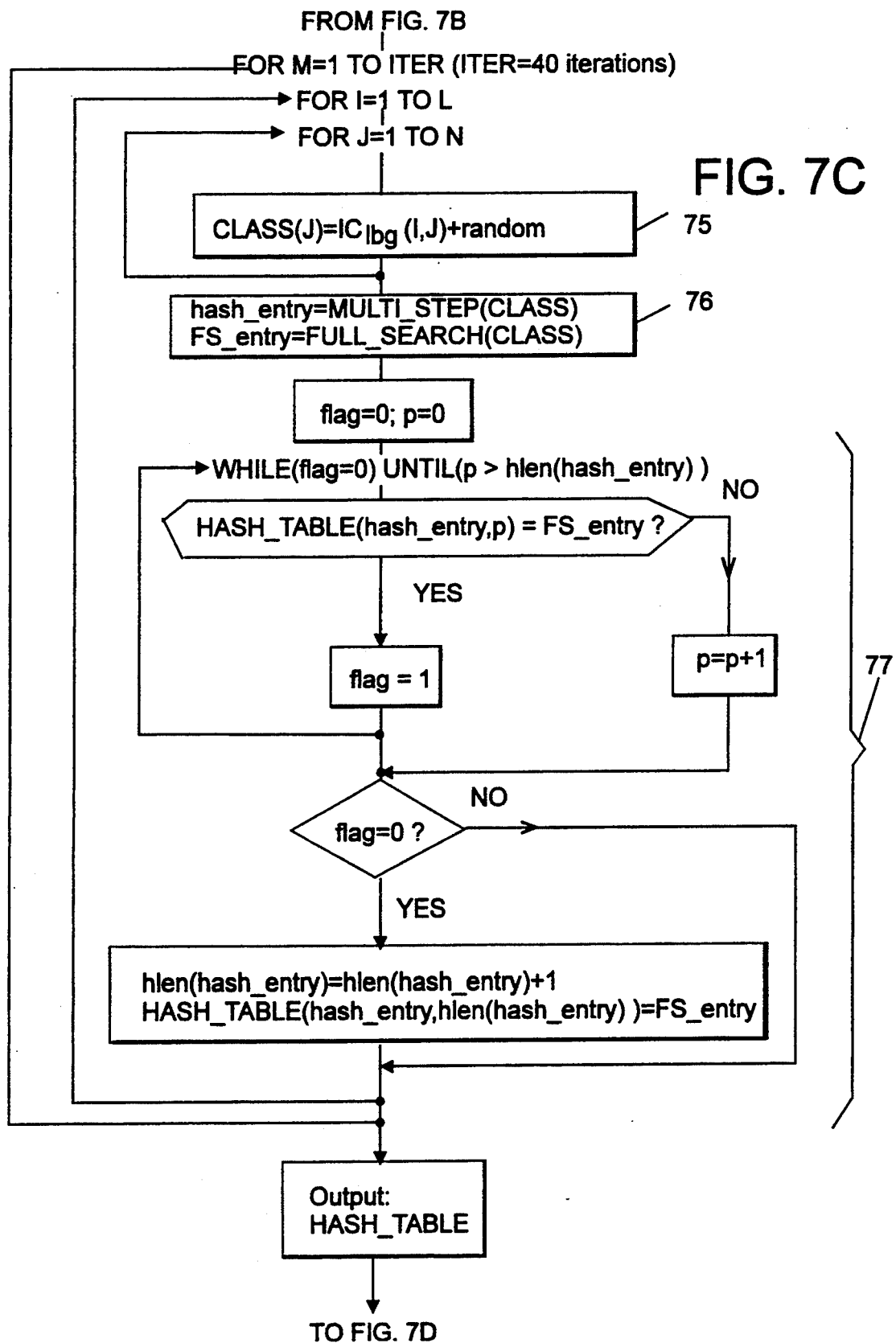
Figure 7D:
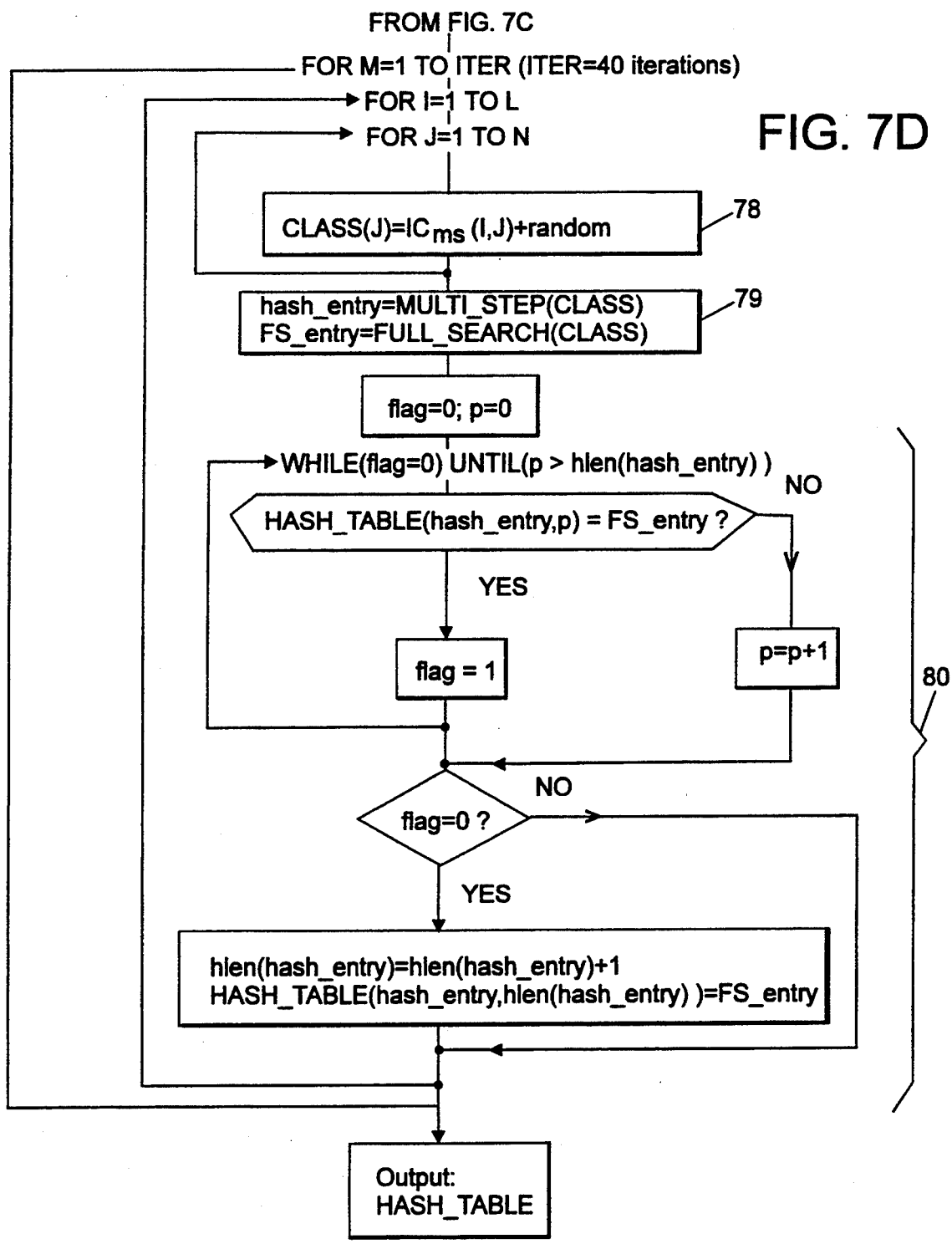

FIG. 10B is a flow diagram of the Multi-Step-Re-Quantization function ind, Q=MULTI_STEP(X) of FIGS. 7A and 7C.

FIG. 10C is a flow diagram of the function ind=FULL_SEARCH(X) of FIGS. 7B and 7C.

FIG. 10D is a flow diagram of the function S=DIST_c (I, Vect), computing the Euclidian distance between the Ith vector of the set C and Vect, of FIG. 9A.

The tree search technique used in the multi-step VQ is sub-optimal. The output vector is not always the one leading to the lowest quantization error. Moreover, if the input vector is a vector of the codebook ($IC_{lbg}$), it is not always coded by itself, but this occurs seldom enough for the quality not to be affected.

The number of comparisons for a full search LBG VQ is 256, for the HVQ it is reduced to 30 in average, 8 comparisons for the multi-step pre-quantization and about 20 for the full search in the subset pointed.

The parameters can be modified, leading to different results in quality and complexity. If the initial IC_lbg is smaller (than 256), the average number of vectors in the subsets will increase and the complexity as well. If $IC_{lbg}$ is larger, the influence of the multistep pre-quantizer becomes more important and the quality tends to be degraded. The influence of the multi-step pre-quantizer should be limited since such a technique is sub-optimal.

The HVQ is a new technique to perform low complexity vector quantization with the same quality as for the optimal reference method, full search LBG algorithm.

The coding is performed in two steps, the input vectors are first pre-quantized using a multi-step vector quantization technique. The selected vector is a pointer in a Hash-table, each vector pointing to a subset of vectors from the optimal codebook (LBG).

It is necessary to built the codebook of the pointers as a first step and the subsets of vectors of the Hash-table secondly.

Finally, simulation results show comparable subjective quality provided by the HVQ, with respect to the full search LBG with a complexity by a factor ranging from 3 to 5.

We claim:

1. A computer implemented method for encoding digital signals using vector quantization wherein the input digital signals are grouped into input vectors of N digital signal components that are compared to a limited number of vectors of an initial codebook, representative of the digital signal to be coded, the vector quantization comprising the following steps:
   prequantizing said input digital signals via execution of a computer program for multi-step vector quantization (VQ) of the digital signal input vectors to generate an index pointer in a computer memory stored Hash-table which points to a subset of vectors of said initial codebook;
   full searching with said subset of vectors of said initial codebook to obtain a final coded vector that most closely matches said input vector.

2. The method according to claim 1 wherein prequantizing of said input vectors is performed by encoding each input vector by a vector from computer memory of an intermediary codebook, each vector in said intermediary codebook representing one of said index pointers in said Hash-table.

3. The method of according to claim 2 wherein said intermediary codebook is built from the initial codebook using multi-step vector quantization (VQ).

4. The method according to anyone of claims 1-3 further comprising building the Hash-table including the following steps:
   a. coding all the vectors of said initial codebook using multi-step quantization;
   b. coding all the vectors of said intermediary codebook by the vectors of said initial codebook using full-search quantization;
   c. coding all the vectors of said initial codebook to which a small, random perturbation is applied using multi-step and full search quantization;
   d. coding all the vectors of said intermediary codebook to which a small, random perturbation is applied using multi-step and full-search quantization.

5. The method according to claim 4 wherein steps c and d are repeated a plurality of times.

6. The method according to any one of claims 1-3 wherein the digital signals are video signals.

7. The method according to claim 6 wherein said encoding is performed on an error prediction image.

8. A vector quantized for encoding digital signals with high efficiency comprising an initial codebook containing a limited number of vectors representative of the signal to be coded, an intermediary codebook containing vectors built from the initial codebook using multi-step vector quantization, and a Hash-table including subsets of the initial codebook, said vectors in said intermediary codebook representing index pointers into said Hash-table.

9. The vector quantizer according to claim 8 wherein said digital signals are video signals.

* * * * *